United States Patent
Taylor et al.

(10) Patent No.: US 11,011,658 B2
(45) Date of Patent: May 18, 2021

(54) METHOD AND SYSTEM FOR WAVEGUIDE THERMOPHOTOVOLTAIC POWER GENERATION

(71) Applicant: U.S. Army Research Laboratory, Adelphi, MD (US)

(72) Inventors: Patrick J. Taylor, Vienna, VA (US); Harry S. Hier, Sykesville, MD (US); Ivan C. Lee, Excelsior, MN (US); Mark Dubinsky, Olney, MD (US); Zun Zhang, Fairfax, VA (US); Priyalal S. Wijewarnasuriya, Germantown, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/407,966

(22) Filed: May 9, 2019

(65) Prior Publication Data
US 2020/0357945 A1    Nov. 12, 2020

(51) Int. Cl.
*H01L 31/054*    (2014.01)
*H01L 31/068*    (2012.01)
*H02S 10/30*    (2014.01)

(52) U.S. Cl.
CPC ...... *H01L 31/0543* (2014.12); *H01L 31/0547* (2014.12); *H01L 31/068* (2013.01); *H02S 10/30* (2014.12)

(58) Field of Classification Search
None
See application file for complete search history.

(56) References Cited

U.S. PATENT DOCUMENTS

| | | | | |
|---|---|---|---|---|
| 4,421,721 A | * | 12/1983 | Byer | C30B 15/00 |
| | | | | 117/202 |
| 5,057,162 A | * | 10/1991 | Nelson | F21H 1/02 |
| | | | | 136/253 |
| 5,611,870 A | * | 3/1997 | Horne | G02B 5/204 |
| | | | | 136/253 |
| 9,964,494 B1 | * | 5/2018 | Poole | G01N 21/7703 |
| 2014/0234787 A1 | * | 8/2014 | De La Sovera | F23D 14/04 |
| | | | | 431/12 |
| 2015/0228827 A1 | * | 8/2015 | Casse | H02S 10/30 |
| | | | | 136/253 |

(Continued)

OTHER PUBLICATIONS

Elgas "Blue Flame vs Yellow Flame vs Red Flames—Gas Flame Color" https://www.elgas.com.au/blog/1585-why-does-a-gas-flame-burn-blue-lpg-gas-natural-propane-methane, Last Updated: Nov. 1, 2019 (Year: 2019).*

(Continued)

*Primary Examiner* — Magali P Slawski
(74) *Attorney, Agent, or Firm* — Eric B. Compton

(57) ABSTRACT

Method and system for wavelength thermophotovoltaic (WTPV) power generation. In one embodiment, the system comprises a refractory waveguide that collects broadband infrared light generated by a heat source; a filter that filters the collected broadband infrared light to generate narrow-band infrared light; and a thermophotovoltaic (TPV) converter, thermally de-coupled from the heat source, that receives the narrow-band infrared light and converts the received narrow-band infrared light to electrical power.

24 Claims, 6 Drawing Sheets

(56) References Cited

U.S. PATENT DOCUMENTS

| | | | | |
|---|---|---|---|---|
| 2015/0377701 | A1* | 12/2015 | Pawluczyk | G01J 3/0243 356/301 |
| 2017/0128271 | A1* | 5/2017 | Freer | A61F 13/00063 |
| 2019/0100112 | A1* | 4/2019 | Jaensch | H01M 10/613 |
| 2019/0309205 | A1* | 10/2019 | Guo | B29C 45/0001 |

OTHER PUBLICATIONS

R. DiMatteo, P. Greiff, S. Finberg, K. Young-Waithe, H. Choy, M. Masaki, C. Fonstad, "Enhanced photogeneration of carriers in a semiconductor via coupling across a nonisothermal nanoscale vacuum gap", Appl. Phys. Lett. vol. 79, No. 12 p. 1894 (2001).

Products LHPG Sapphire Fibers, http://www.micromaterialsinc.com/specsFiber.html, MicroMaterials Inc., 2018.

Kyocera Single Crystal Sapphire, https://global.kyocera.com/prdct/fc/product/pdf/s_c_sapphire.pdf, Kyocera Corporation, © 2018.

Fiber Optics, Thoughtventions Unlimited LLC, http://www.tvu.com/SFO.html, (webpage states: "Last updated: Jul. 2015").

Wideband mid-IR Bragg mirrors, https://www.tfp.ethz.ch/IR/Bragg_04.pdf (date unknown, but available prior to patent application filing).

T. Elsmann, T. Habisreuther, A. Graf, M. Rothhardt, H. and Bartelt "Inscription of first-order sapphire Bragg gratings using 400 nm femtosecond laser radiation" Optics Express, vol. 21, No. 4, p. 4591 (2013).

C. Ferrari, F. Melino, M. Pinelli, P. Spina, M. Venturini, "Overview and Status of Thermophotovoltaic Systems", Energy Procedia, vol. 45 p. 160. (2014).

R. Kaspi, S. Barnett, L. Hultman, "Growth of InGaAsSb Layers in the Miscibility Gap: Use of very-low-energy ion irradiation to reduce alloy decomposition", Journ. Vac, Sci and Technol. B, Nanotechnology and Microelectronics: Materials, Processing, Measurement and Phenomena, vol. 13, p. 978. (1995).

* cited by examiner

US 11,011,658 B2

METHOD AND SYSTEM FOR WAVEGUIDE THERMOPHOTOVOLTAIC POWER GENERATION

GOVERNMENT RIGHTS IN THIS DISCLOSURE

The invention described herein may be manufactured, used, and/or licensed by or for the United States Government.

FIELD

Embodiments of the present disclosure generally relate to waveguide thermophotovoltaic power generation.

BACKGROUND

Thermophotovoltaic (TPV) power generation is well-known power generation technique to generate electrical power by converting a flux of infrared light emitted from a heat source into electrical power. TPV is limited in use due to several significant technology issues. Theoretical predictions tend to overestimate system conversion efficiency, with the observed conversion efficiency being almost always lower, and sometimes very much lower. Additionally, the lifetime of such systems is low as evidenced by the drop in efficiency over time.

Classical TPV systems have been shown to yield as high as 10%, but usually the observed efficiency is closer to the order of 1% and sometimes much lower. This discrepancy between theoretical predictions and experimental observations stems from large losses from the complex components, as well as thermal effects that are obtained from the required high temperature.

The thermal problem for classical TPV systems is acute and manifold. For example, the converter materials can have phase instabilities that accelerate with high temperature and rapidly degrade system performance. Another example of the thermal problem is manifested in reduced collection efficiency due to enhanced thermal scattering of photo-generated carriers. A third example of the thermal problem is diffusion of the desired dopant profile for the p-n junction and interdiffusion of the alloy materials that must be maintained constant to absorb the desired wavelengths, A fourth example of the thermal problem is the thermal shock resistance and mass-transport resistance of the components which must survive repeated thermal cycling from room-temperature to temperatures as high as 2000° C. with no deformation or cracking.

Making the issues worse for traditional TPV, an interesting path toward higher efficiency is evanescent coupling of infrared photons emitted by the heat source with the converter across sub-micrometer gaps. In all likelihood these thermal limitations would be enhanced.

Therefore, there is a need in the art for a method and apparatus for thermophotovoltaic power generation that mitigates effects from damaging heat.

SUMMARY

Embodiments of the present invention generally relate to a method and apparatus for waveguide thermophotovoltaic power generation substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
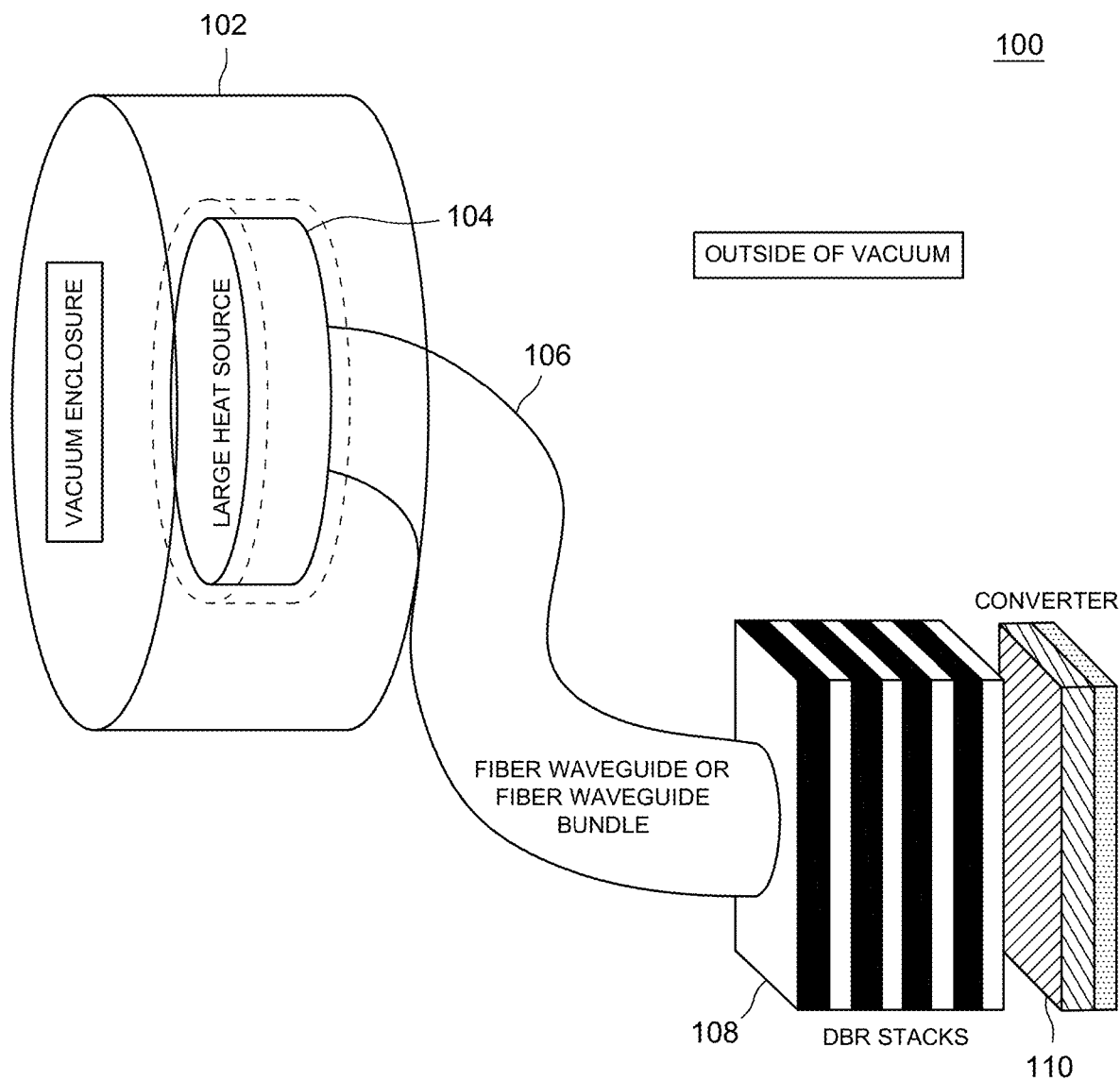
FIG. 1 is a block diagram of a waveguide thermophotovoltaic (WTPV) power generation system in accordance with one or more embodiments of the present invention.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present invention generally relate to a method and apparatus for waveguide thermophotovoltaic (WTPV) power generation. A WTPV power generation system (which may also be referred to as a WTPV power generator) utilizes a refractory waveguide (e.g., refractory optical fibers) and passive optical components to generate approximately monochromatic infrared light and convert that into useful electrical power. The WTPV power generator can be configured as a discrete apparatus is some embodiments.

The WTPV power generation system couples broadband infrared light, generated by a heat source whose blackbody temperature is at least 1273 Kelvin (e.g., an incandescent heat source, a catalytic flameless combustion heat source, a burning heat source, and the like), into a refractory waveguide, (e.g., refractory optical fibers, or fiber bundles, or fibers having internal Bragg gratings) and directs it through optical filter components (such as distributed Bragg reflector (DBR) optical stacks) such that as narrow a range as experimentally feasible of infrared light is obtained on the opposite waveguide side. By using special refractory optical fiber that can accept infrared light, capture only (or substantially only) the wavelength range that is to be converted to power (eliminating all or nearly-all others), and direct it to a thermophotovoltaic (TPV) device, parasitic and damaging heat are eliminated. In one or more embodiments, broadband infrared light ranges from near 1-10 micrometers in wavelength, and the narrow-band infrared light is about 2 micrometers in wavelength. In some embodiments, the heat source may be part of the WTPV power generation system, although in other embodiments a heat source that is not part of the WTPV power generation system may be used.

The robust refractory optical components of the WTPV power generation system capture and filter the wavelength of the infrared light to a more narrow band—i.e., a narrow-band of infrared light that is substantially situated about a single wavelength. Although the system's optical design is intended to obtain monochromatic light, those skilled in the art will recognize that generally there is some distribution (e.g., a Gaussian-shaped distribution) having most of the light in the desired range, but not all; as such, the obtained light is essentially monochromatic. In one or more embodiments, the generated broadband infrared light ranges from near 1-10 micrometers in wavelength, and the narrow-band infrared light is about 2 micrometers in wavelength.

In some embodiments, the out-of-band wavelengths (i.e., photons outside of the wavelength range of the narrow-band infrared light) are filtered back to the heat source. The generated narrow-band infrared light is delivered to a TPV converter, such as a simple p-n junction, that has no direct line-of-sight to the heat source. The flux intensity of the infrared light may mimic evanescent coupling and result in much higher power output over time. Because the infrared light is delivered along the waveguide, the intensity of the infrared light is nearly identical to the intensity in the immediate vicinity of the heat source where it was originally coupled into the refractory waveguide, even though there is no direct line-of-sight. Further, because there is no line-of-sight between the converter and the heat source, the converter can be positioned far away from the damaging thermal energy of the heat source and thereby significantly increase the lifetime of the entire system.

A special TPV device (p-n junction) sensitive to the wavelength obtained via filtering accepts that light and converts it to useful electrical power. Operating in this way, the thermal damage to the TPV device is minimized because it is thermally decoupled while being optically coupled. Because the wavelength range is narrow and out-of-band photons are reflected back into the heat source, the energy efficiency is increased, and the size, weight, volume and efficiency of the system can be maximized.

The active power generating component, e.g., a p-n junction converter, is thermally de-coupled from the heat source but remains optically coupled only for the wavelength of interest for power conversion. Such complete decoupling of the semiconductor-based converter and the intense heat source prevents acute irreversible thermal damage, chemical decomposition, chemical interdiffusion, and oxidation of semiconductor-based converter components (e.g., InGaAs, InGaAsSb, PbSrTe, and the like). The refractory optics allows a non-contact, non-line-of-sight transfer of the infrared light to the sensitive converter such that the converter can be maintained at, or very near room-temperature.

Because the converter is coupled through a waveguide such as a fiber, or fiber bundle, the converter can be positioned remotely with respect to the heat source, and may be outside a vacuum enclosure protecting the heat source enabling improved size, weight and power. The WTPV system's refractory optical fibers and passive optical components allow the heat source to be packaged in isolation so that heat losses can be minimized, and the heat source can be thermally isolated to reduce energy loss to the environment. In one or more embodiments, the vacuum enclosure allows coupling of broadband infrared light that is generated by the heat source (or alternative means) and is outside of the vacuum enclosure.

The non-heated, passive optical components allow monochromatic spectral purity to be obtained. The out-of-band photons are reflected back to the heat source by solid-state optical components such as DBR thin-film structures, fiber Bragg gratings within the fibers, and DBR structures monolithically integrated onto the detector, such that the overall efficiency of the system is increased and fuel usage improved by photon recycling. DBR structures can achieve greater than 99.9% reflectivity for some ranges of infrared light, and integrated Bragg gratings can be imprinted within the core of fibers and fiber bundles which can also contribute to the generation of a near monochromatic infrared wavelength.

By de-coupling the generated heat from the other working components by the use of waveguides, for example refractory sapphire fibers, the WTPV system eliminates parasitic and damaging heat effects. Because the heat is disallowed from reaching the converter, thermal phase stability is assured and the converter can operate at, or near, room-temperature, so thermal scattering effects are reduced. Further, heat-driven effects such as interdiffusion of dopants are mitigated. Furthermore, since only two components of the system are heated—the heat source and the refractory fibers—thermal shock and thermal deformation is reduced or eliminated.

The WTPV power generation system may be used in any suitable application involving direct energy conversion between infrared light and electrical power. In some embodiments, the WTPV power generation system may be used for remote off-grid power generation where there is access to simple hydrocarbon fuels, such as high-adventure applications where normal grid power is unavailable. In one or more embodiments, the WTPV power generation system may be used for remote off-grid power generation where batteries must be recharged using the heat energy released by the combustion of logistics fuel. In some embodiments, the system may be silent and covert. In certain embodiments, the system may be used for remote camping or hiking where normal grid power is unavailable, or for industrial processes such as glass manufacturing or similar high temperature processes that release waste heat at high temperature.

In some alternative embodiments, the heat source is not part of the WTPV power generation system; in one or more of such embodiments, the WTPV power generation system comprises a refractory waveguide that collects broadband infrared light generated by a heat source, a filter that filters the broadband infrared light to generate narrow-band infrared light, and a TPV converter, thermally de-coupled from the heat source that is either custom-designed and engineered (such as a catalytic heat source) or any arbitrary pre-existing heat source whose blackbody radiation falls into the wavelength band of relevance, that receives the narrow-band light and converts the received narrow-band light to electrical power.

FIG. 1 is a block diagram of a waveguide thermophotovoltaic (WTPV) power generation system 100 in accordance with one or more embodiments of the present invention. Generally, the WTPV power generation system 100, which also may be referred to as "WTPV system 100" or "system 100", operates by first accepting an initially wide wavelength range of infrared photons from an incandescent heat source into refractory waveguide components, such as sapphire optical fibers or fiber bundles. Once the broadband infrared light is captured, a narrow band of near-monochromatic infrared light (i.e., a narrow-band of infrared light that is substantially situated about a single wavelength) is then filtered out and the out-of-band photons are recycled back to the incandescent heat source using passive optical components such as DBR thin film mirrors, integrated Bragg gratings laser-inscribed within the fiber itself, and metallic broadband infrared reflectors, such as gold. These metallic reflectors may be located on the opposite side of the TPV converters; any light that isn't absorbed by the TPV converter could be reflected back into the TPV converter such that it has a second chance to be absorbed.

The WTPV system 100 shown in FIG. 1 comprises a vacuum enclosure 102, a heat source 104, a refractory waveguide 106, a distributed Bragg reflector (DBR) 108, and a thermophotovoltaic (TPV) converter 110. The heat source 104 is enclosed within the vacuum enclosure 102 and is coupled to one end of the refractory waveguide 106, which extends outward from the vacuum enclosure 102. The distal end of the refractory waveguide 106 (which may also be referred to as "waveguide 106") is coupled to the DBR 108. The DBR 108 is further coupled to the TPV converter 110; i.e., the DBR 108 is deposited as a thin film stack of multiple layers of two dissimilar materials.

In some embodiments, the TPV 110 may be a p-n junction TPV converter.

The heat source 104 is operated at high temperatures, e.g., near or above 1000° C., and as such is maintained in the vacuum 102 to reduce parasitic heat flows from convection that would reduce system efficiency. The heat source 104 emits infrared light having a broadband infrared spectrum that is collected by the refractory waveguide 106 (i.e., the emitted broadband infrared light is coupled to the refractory waveguide 106). In some embodiments, the heat source 104 is an incandescent heat source at near, for example, 1000° C., which emits infrared light with spectral range similar to a blackbody with a peak near 2.0-2.5 micrometers. In one or more embodiments, the vacuum enclosure 102 allows coupling of broadband infrared light that is generated by the heat source 104 (or alternative means) and is outside of the vacuum enclosure 102.

In one or more embodiments, the refractory waveguide 106 comprises one or more refractory optical fibers, such as those made from sapphire. Sapphire fibers have a melting point above 2000° C., and a low thermal conductivity that is less than 0.1 W/mK at the operational temperature of near 1000° C. Additionally, sapphire material has a very broad transmission of the infrared light of interest to the WTPV system 100, for example, from 1.5 to 2.5 micrometers. As one example, the ends of 1 meter long sapphire fibers having a diameter of 100 µm may be used; the fibers may be prepared with suitable flameless catalyst to enhance easy coupling of the infrared light of interest for WTPV into the fiber (e.g., a rhodium oxide catalyst on an Rh03 coated fiber). Because the optical loss per unit length is negligible in such fibers, the length is of secondary importance.

Once the infrared light is successfully captured within the refractory waveguide 106, its spectral range is then spectrally filtered by the DBR 108. This filtering is designed to reflect the undesired wavelengths back to the heat source 104 such that the otherwise lost energy is recycled back to useful heat, and transmit only the special wavelength (1.5 to 2.5 micrometers) that can be converted to electrical power.

The DBR 108 is a DBR heterostructure comprising a multi-layer stack of different materials that have a large difference in optical properties, such as their index of refraction. Based on the optical properties of the materials and by tailoring the relative thicknesses of the layers, they can be designed to selectively reflect certain wavelengths and transmit others. In certain embodiments, the DBR 108 is a DBR heterostructure comprising alternating layers of lead telluride (PbTe) and barium fluoride (BaF2) whose relative thicknesses provide very high reflectivity (e.g., in some embodiments the reflectivity may be >90% or more) for infrared light having a design wavelength of 11 micrometers, but broadband reflection is obtained from 9 to 20 micrometers; the transmission is optimized (reflection is minimized) at a peak wavelength of approximately 7 micrometers. In one or more of these embodiments, the DBR 108 comprises three layers of PbTe, each layer having a refractory index of 5.7 and a thickness of approximately 1 micrometer and two layers of BaF2, each layer having a refractory index of 1.45 and a thickness of 2 micrometers disposed atop a layer of silicon.

The filtered infrared light from the DBR 108 is then directed through a refractory waveguide to the p-n junction TPV converter and converted to electrical power. The converter 110 is a special TPV device (p-n junction) sensitive to the wavelength obtained via filtering. The converter 110 accepts the filtered light and converts it to useful electrical power.

In some alternative embodiments, the entire refractory waveguide 106 is the refractory waveguide 106 and the DBR 108 may be entirely contained within the vacuum enclosure 102. In some other alternative embodiments, the refractory waveguide 106, the DBR 108, and the converter 110 may all be entirely contained within the vacuum enclosure 102 with an output from the converter 110 extending outward from the vacuum enclosure 102.

Figure 2:
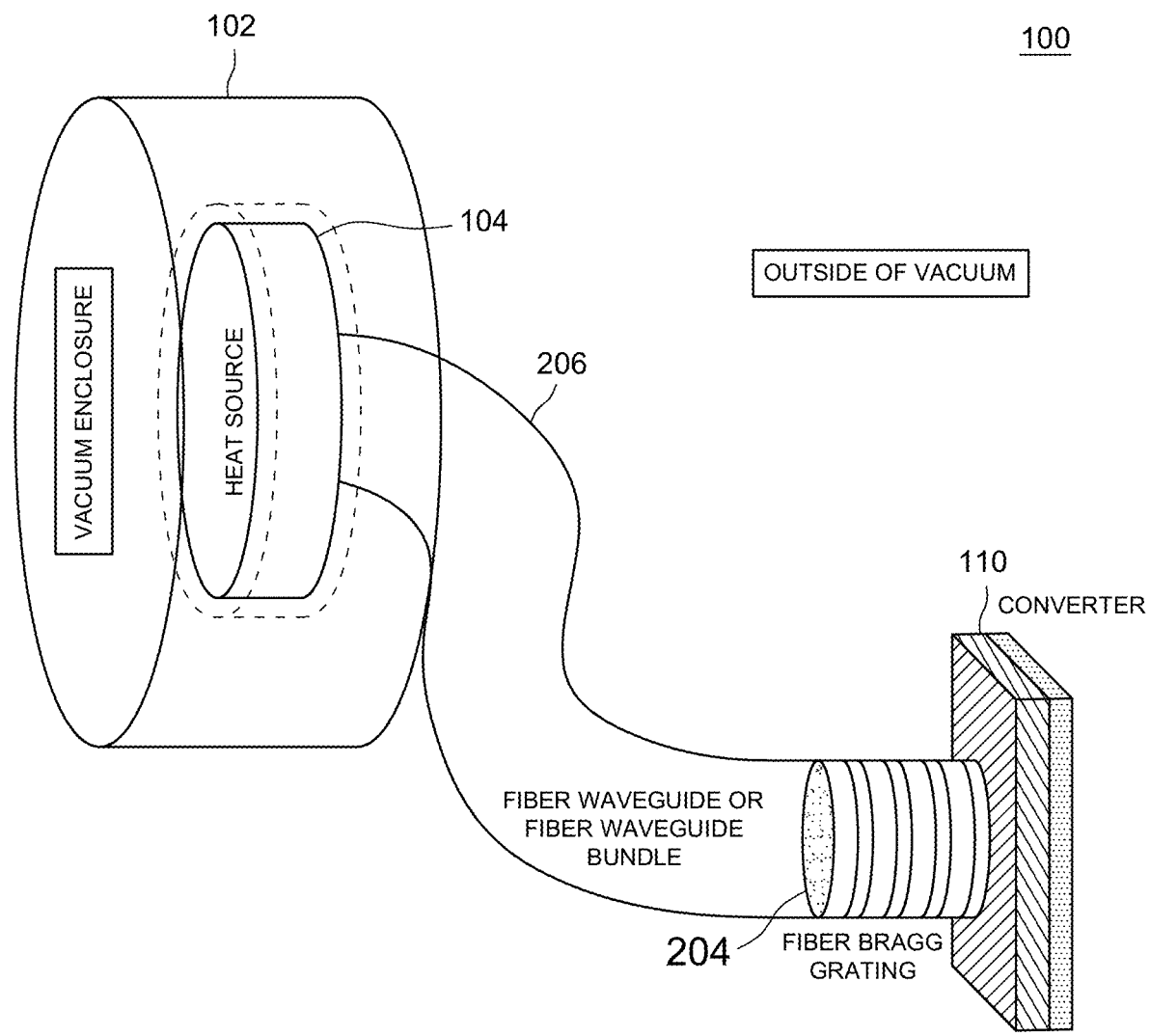
FIG. 2 is a block diagram of another embodiment of the waveguide WTPV power generation system.

FIG. 2 is a block diagram of another embodiment of the waveguide WTPV power generation system 100. The WTPV system 100 shown in FIG. 2 comprises the vacuum enclosure 102 containing the heat source 104, which is coupled to one end of a refractory waveguide 206 that extends outward from the vacuum enclosure 102. The distal end of the refractory waveguide 206 (which may also be referred to as "waveguide 206") is coupled to the TPV converter 110.

Figure 9:
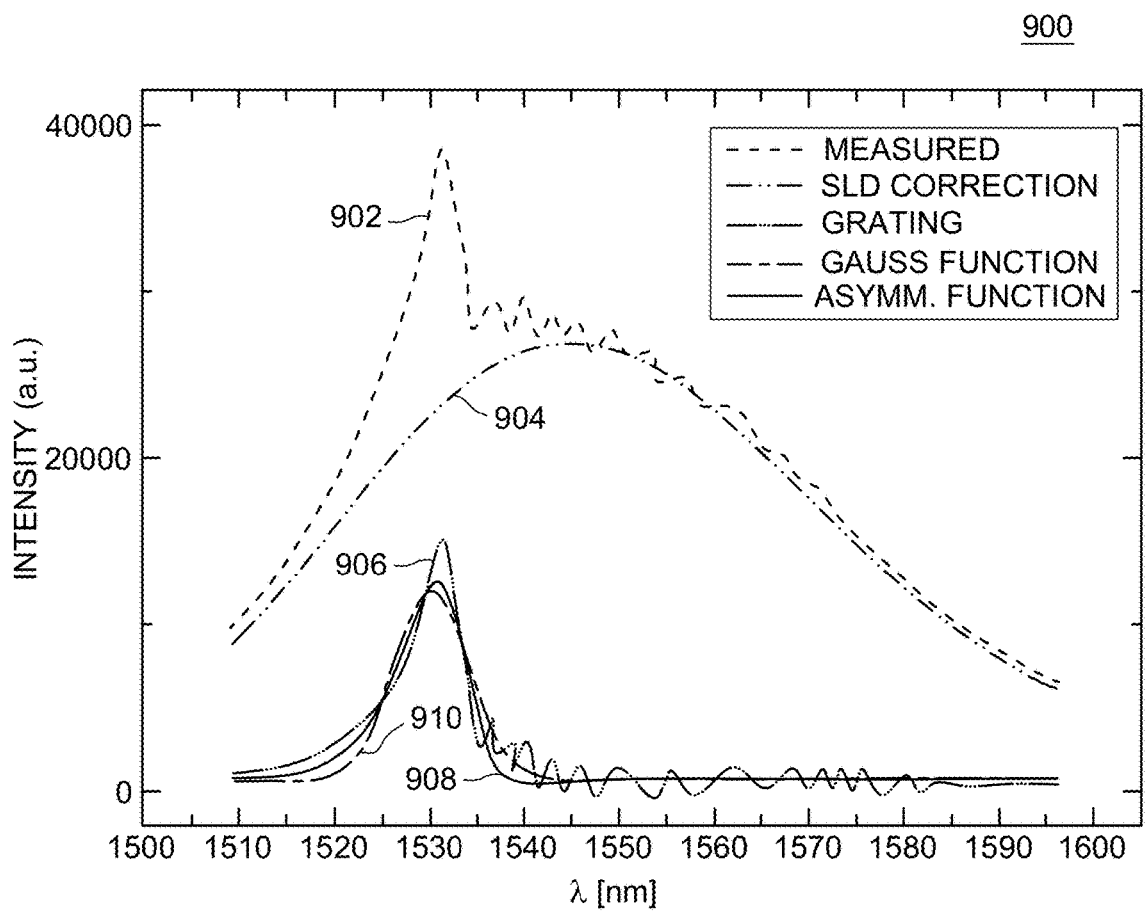
FIG. 9 depicts a graph showing enhancement of infrared light near 1530 nm from unoptimized fiber Bragg gratings imprinted within a sapphire fiber in accordance with one or more embodiments of the present invention.

The waveguide 206 comprises a fiber Bragg grating 204 which produces a wavelength selectivity while interfering with the transmission of undesired wavelengths and enhancing the desired wavelength; one example of peak wavelength selection is shown in FIG. 9 described below. In some embodiments, the waveguide 206 is a fiber (e.g., a sapphire fiber) having a fiber Bragg grating 204 to enhance infrared light at or near 1530 nm. In certain embodiments, the waveguide 206 comprises a plurality of fibers, where each fiber has a fiber Bragg grating 204 to obtain the desired wavelength.

The filtered light from the refractory waveguide 206 is coupled to the converter 110 and converted to electrical power by the converter 110.

In some alternative embodiments, the refractory waveguide 106 may be entirely contained within the vacuum enclosure 102 and coupled at the boundary of the vacuum enclosure 102 to the converter 110. In some other alternative embodiments, the refractory waveguide 106 and the converter 110 may both be entirely contained within the vacuum enclosure 102 with an output from the converter 110 extending outward from the vacuum enclosure 102.

Figure 3:
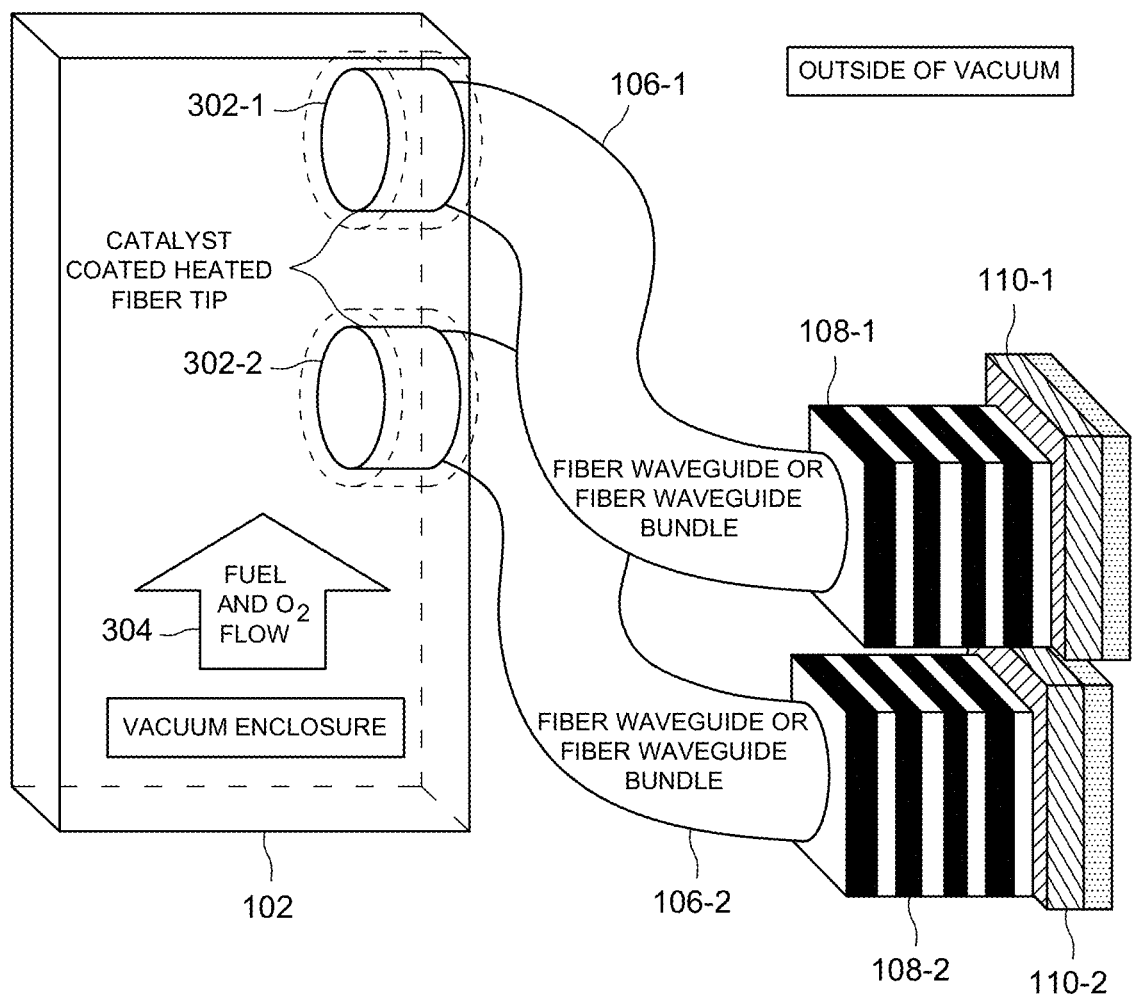
FIG. 3 is a block diagram of still another embodiment of the WTPV power generation system.

FIG. 3 is a block diagram of still another embodiment of the WTPV power generation system 100. The WTPV system 100 shown in FIG. 3 comprises the vacuum enclosure 102. A first refractory waveguide 106-1 has a catalyst coated heat fiber tip 302-1 on one end within the vacuum enclosure 102, extends outward from the vacuum enclosure 102, and is coupled at its distal end to a first DBR 108-1. A second refractory waveguide 106-2 has a catalyst coated heat fiber tip 302-2 on one end within the vacuum enclosure 102, extends outward from the vacuum enclosure 102, and is coupled at its distal end to a second DBR 108-2. The DBRs 108-1 and 108-2 are coupled to TPV converters 110-1 and 110-2, respectively.

In embodiments such as those depicted in FIG. 3, rather than utilizing the heat source 104 within the vacuum enclosure 102, a catalytic, flameless combustion is utilized as the heat source to provide the infrared light having a broadband infrared spectrum. In one or more embodiments, hydrocarbon fuel is oxidized in the presence of oxygen or air (depicted as fuel and $O_2$ flow 304) without a flame on certain precious metal oxide catalysts, for example platinum oxide.

In some alternative embodiments, one or more of the refractory waveguides 106, the DBRs 108, and the converter 110 may be contained within the vacuum enclose 102. In one or more alternative embodiments, fewer or more of the refractory waveguides 106/DBRs 108/converters 110 may be used in the WTPV power generation system 100. Additionally or alternatively, one or more of the DBRs 108 may be replaced by a fiber Bragg grating within the corresponding refractory waveguide 106.

Figure 4:
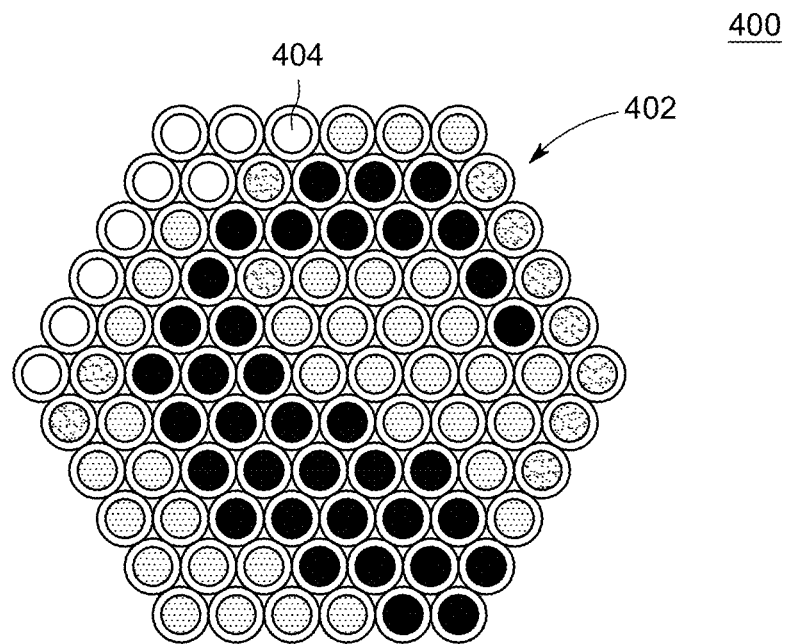
FIG. 4 is a depiction of a sapphire fiber bundle utilized in one of more embodiments of the WTPV power generation system.

FIG. 4 is a depiction of a sapphire fiber bundle 400 utilized in one of more embodiments of the WTPV power generation system 100. The sapphire fiber bundle 400 comprises a plurality of individual sapphire fibers 404 packaged into a close-packed arrangement 402 that can successfully accept emitted infrared light from a larger area than an individual fiber. In one or more embodiments, bundles are designed in hexagonal close-packed arrangement, as depicted in FIG. 4, to maximize areal acceptance of light, although in certain embodiments other arrangements of fibers may be used in a fiber bundle.

Figure 5:
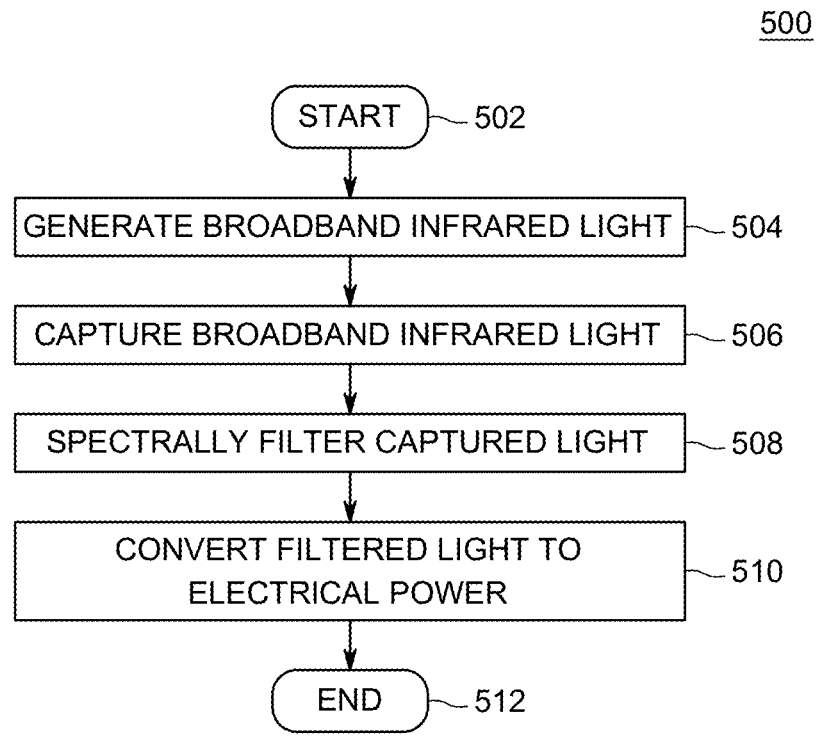
FIG. 5 is a flow diagram of a method for generating power using a WTPV power generation system in accordance with one or more embodiments of the present invention.

FIG. 5 is a flow diagram of a method 500 for thermophotovoltaic (TPV) power generation in accordance with one or more embodiments of the present invention. In one or more embodiments of the method 500, a waveguide thermophotovoltaic (WTPV) system is utilized for generating the power, such as the WTPV power generation system 100 previously described.

The method 500 starts at step 502 and proceeds to step 504. At step 504, broadband infrared light is generated using a heat source. In some embodiments the broadband infrared light may be generated by a heat source such as the heat source 104. In other embodiments, the heat source may be a catalytic, flameless combustion as described with respect to FIG. 3. The method 500 proceeds to step 506.

At step 506, the broadband infrared light is collected by a refractory waveguide, such as the refractory waveguide 106 or the refractory waveguide 206. At step 508, the captured infrared light is spectrally filtered to transmit only or substantially only the wavelength (1.5 to 2.5 micrometers) that can be converted to electrical power. In some embodiments, the infrared light is filtered by a DBR such as the DBR 108; in other embodiments, the filtering is done by a fiber Bragg grating within the refractory waveguide. In some embodiments, the filtering is designed to reflect the undesired wavelengths back to the heat source such that the otherwise lost energy is recycled back to useful heat.

The method 500 proceeds to step 510, where the filtered infrared light is converted to electrical power by a TPV converter. In some embodiments, the TPV is a simple p-n junction converter. The method 500 proceeds to step 512 where it ends.

Figure 6:
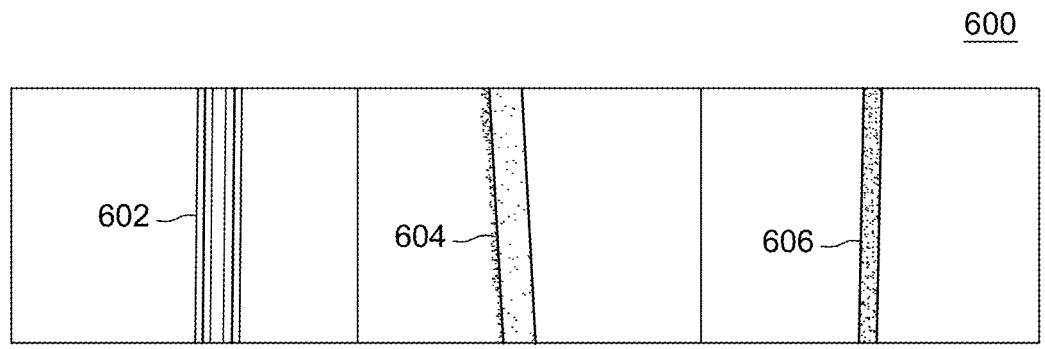
FIG. 6 depicts renderings of microscope images of a plurality of exemplary sapphire fibers that may be used in one or more embodiments of the present invention.

FIG. 6 depicts renderings of microscope images of a plurality of exemplary sapphire fibers 600 that may be used in one or more embodiments of the present invention. Fiber 602 is a bare sapphire fiber. Fiber 604 is an aluminum oxide ($AL_2O_3$) coated sapphire fiber. Fiber 606 is an $AL_2O_3$ coated fiber prepared with a rhodium oxide catalyst, although in other embodiments other types of suitable flameless catalysts may be used to prepare the fiber. In some embodiments, the fibers 602, 604 and 606 each have a diameter of 100 μm.

Figure 7:
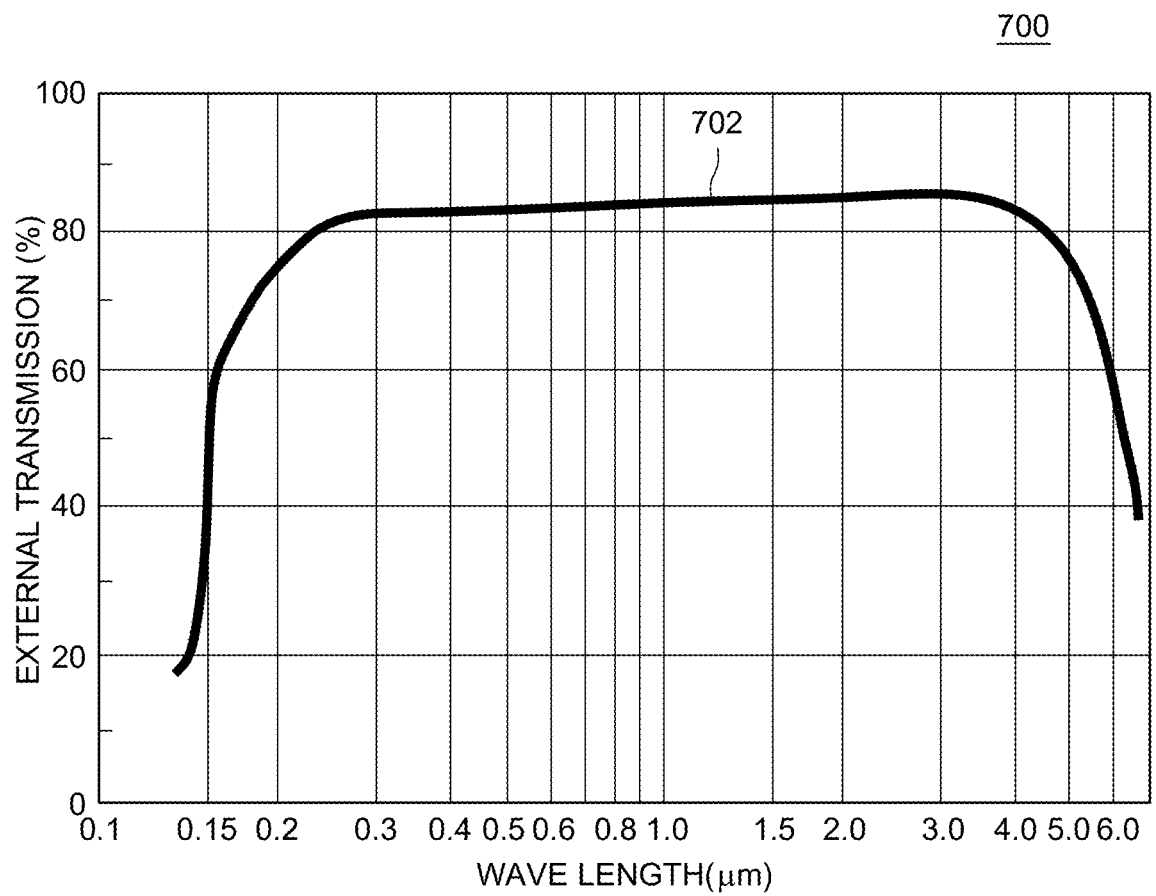
FIG. 7 depicts a graph illustrating sapphire material transmission in accordance with one of more embodiments of the present invention.

FIG. 7 depicts a graph 700 illustrating sapphire material transmission in accordance with one of more embodiments of the present invention. The graph 700 has an x-axis indicating wavelength (as measured in μm) and a y-axis indicating percentage of external transmission. A plot 702 shows the transmission of sapphire material for various wavelengths. As shown by the plot 702, the sapphire material has a broad transmission of infrared light which may be utilized by the WTPV system 100, e.g., from 1.5-2.5 μm. Surface reflection losses are included.

Figure 8:
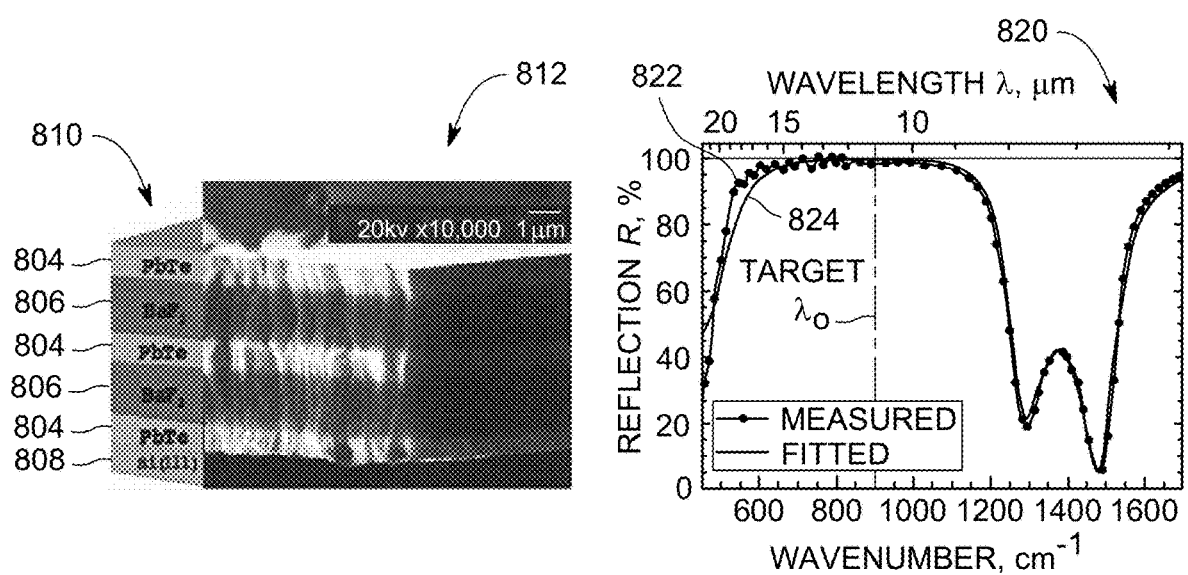
FIG. 8 depicts a schematic drawing of a distributed Bragg reflector (DBR) heterostructure and a corresponding scanning electron microscope (SEM) image, and a graph of the room temperature reflection spectrum of the DBR heterostructure in accordance with one or more embodiments of the present invention.

FIG. 8 depicts a schematic drawing of a distributed Bragg reflector (DBR) heterostructure 810 and a corresponding scanning electron microscope (SEM) image 812, and a graph 820 of the room temperature reflection spectrum of the DBR heterostructure 810 in accordance with one or more embodiments of the present invention.

The DBR heterostructure 810 comprises alternating layers of lead telluride (PbTe) 804 and barium fluoride ($BaF_2$) 806 (i.e., three layers of PbTe 804 and two layers of $BaF_2$ 806) disposed atop a silicon layer 808. In the exemplary DBR heterostructure 810, the relative thicknesses of the, for example, approximately 1 micrometer thick PbTe layers 804 and the, for example, approximately 2 micrometer thick $BaF_2$ layers 806 have been determined to provide very high reflectivity for infrared light having a design wavelength of 11 μm. Broadband reflection is obtained from 9-20 μm, and the transmission is optimized (i.e., reflection is minimized) near 7 μm.

The graph 820 depicts the highly selective infrared reflectivity obtained from the DBR heterostructure 810 and comprises a y-axis showing the percent reflection R, a first x-axis showing wavenumber measured in reciprocal centimeters, and a second x-axis showing wavelength measured in μm. The graph 820 further comprises a measured curve 822 based on a plurality of measurements and a fitted curve 820. As shown by the graph 820, the percent reflection R at the target wavelength 11 μm is on the order of 99.8%. In other embodiments, the DBR heterostructure 810 may be designed for other target wavelengths.

FIG. 9 depicts a graph 900 showing enhancement of infrared light near 1530 nm from unoptimized fiber Bragg gratings imprinted within a sapphire fiber in accordance with one or more embodiments of the present invention. The graph 900 comprises a y-axis showing intensity (in arbitrary units) and an x-axis showing wavelength (in nm). The graph 900 further comprises a plurality of measured values 902, a superluminescent diode (SLD) correction 904, grating values 906, a Gauss function curve 910, and an asymmetrical function curve 908. As shown by the graph 900, peak selection at a wavelength of or about 1530 nm is caused by imprinting a Bragg grating within a fiber. In other embodiments, peak selection can be at other wavelengths.

While the foregoing is directed to embodiments of the present disclosure, other and further embodiments of the disclosure may be devised without departing from the basic scope thereof, and the scope thereof is defined by the claims that follow.

The invention claimed is:

1. A wavelength thermophotovoltaic (WTPV) power generation system, comprising:
 a light-emitting heat source which emits infrared light;
 a refractory waveguide that collects the emitted infrared light directly from the light-emitting heat source;
 a filter that filters the collected infrared light to selectively transmit a narrower band of IR wavelengths than what is collected; and
 a thermophotovoltaic (TPV) converter, thermally de-coupled from the light-emitting heat source, that receives the narrower band infrared light and converts the received narrower band infrared light to electrical power.

2. The system of claim 1, wherein the refractory waveguide comprises at least one optical fiber.

3. The system of claim 2, wherein each optical fiber of the at least one optical fiber is made of sapphire.

4. The system of claim 1, wherein the heat source is located within a vacuum enclosure.

5. The system of claim 1, wherein the filter comprises a distributed Bragg reflector (DBR).

6. The system of claim 2, wherein the filter comprises a fiber Bragg grating within each optical fiber of the at least one optical fiber.

7. The system of claim 1, wherein the TPV converter comprises a p-n junction converter.

8. The system of claim 1, wherein the narrower band infrared light is substantially situated about a single wavelength.

9. The system of claim 1, wherein photons outside of the wavelength range of the narrower band infrared light are reflected back to the heat source.

10. The system of claim 1, wherein the heat source is heated to attain a blackbody temperature at or above 1273 Kelvin.

11. A method for wavelength thermophotovoltaic (WTPV) power generation in a system comprising a light-emitting heat source which emits infrared light, the method comprising:
 collecting, by a refractory waveguide, the emitted infrared light directly from the light-emitting heat source;
 filtering, by a filter, the collected infrared light to selectively transmit a narrower band of IR wavelengths than what is collected; and
 converting, by a thermophotovoltaic (TPV) converter that is thermally de-coupled from the light-emitting heat source and receives the narrower band infrared light, the received narrower band infrared light to electrical power.

12. The method of claim 11, wherein the refractory waveguide comprises at least one optical fiber.

13. The method of claim 12, wherein each optical fiber of the at least one optical fiber is made of sapphire.

14. The method of claim 11, wherein the heat source is located within a vacuum enclosure.

15. The method of claim 11, wherein the filter comprises a distributed Bragg reflector (DBR).

16. The method of claim 12, wherein the filter comprises a fiber Bragg grating within each optical fiber of the at least one optical fiber.

17. The method of claim 11, wherein the TPV converter comprises a p-n junction converter.

18. The method of claim 11, wherein the narrower band infrared light is substantially situated about a single wavelength.

19. The method of claim 11, wherein photons outside of the wavelength range of the narrower band infrared light are reflected back to the heat source.

20. The method of claim 11, wherein the heat source is heated to attain a blackbody temperature at or above 1273 Kelvin.

21. The system of claim 1, wherein the refractory waveguide comprises a plurality of optical fibers in a hexagonal close-packed arrangement.

22. The method of claim 11, wherein the refractory waveguide comprises a plurality of optical fibers in a hexagonal close-packed arrangement.

23. The system of claim 1, wherein the light-emitting heat source comprises an incandescent heat source, a catalytic flameless combustion heat source, or a burning heat source.

24. The method of claim 11, wherein the light-emitting heat source comprises an incandescent heat source, a catalytic flameless combustion heat source, or a burning heat source.

* * * * *